United States Patent [19]

Heinrich et al.

[11] 4,182,983
[45] Jan. 8, 1980

[54] ELECTRONIC AC ELECTRIC ENERGY MEASURING CIRCUIT

[75] Inventors: Theodore M. Heinrich, Murrysville; Joseph J. Zelezniak, Wilkinsburg Boro., both of Pa.

[73] Assignee: Westinghouse Electric Corp., Pittsburgh, Pa.

[21] Appl. No.: 923,530

[22] Filed: Jul. 11, 1978

[51] Int. Cl.$^2$ .................................. G01R 21/06
[52] U.S. Cl. .................................. 324/142
[58] Field of Search .................... 324/142; 364/483

[56] References Cited

U.S. PATENT DOCUMENTS

| | | | |
|---|---|---|---|
| Re. 29,079 | 12/1976 | Gilbert | 324/142 X |
| 3,764,908 | 10/1973 | Elms | 324/142 |
| 3,864,631 | 2/1975 | Zitelli et al. | 324/142 X |
| 4,066,960 | 1/1978 | Milkovic | 324/142 |

*Primary Examiner*—Stanley T. Krawczewicz
*Attorney, Agent, or Firm*—R. W. Smith

[57] ABSTRACT

An electronic AC electric energy measuring circuit converts a di/dt analog input signal into a pulse width modulated signal responsive to the amplitude of a current component of an alternating current energy quantity to be measured. The pulse width modulated signal is produced by a first modulator circuit including an integrator circuit deriving both a modulating frequency signal and a current analog signal proportional to the current component. A multiplying circuit receives a voltage analog input signal and applies it to a reference input of a second modulator circuit. The modulating control of the second modulator circuit receives the pulse width modulated signal so that the multiplying circuit produces a variable amplitude and pulse width modulated signal having an average value equal to an average power measurement. An analog to frequency converter including a second integrator circuit receives the output of the multiplying circuit to produce an output pulse representative of a quantized amount of electric energy.

11 Claims, 5 Drawing Figures

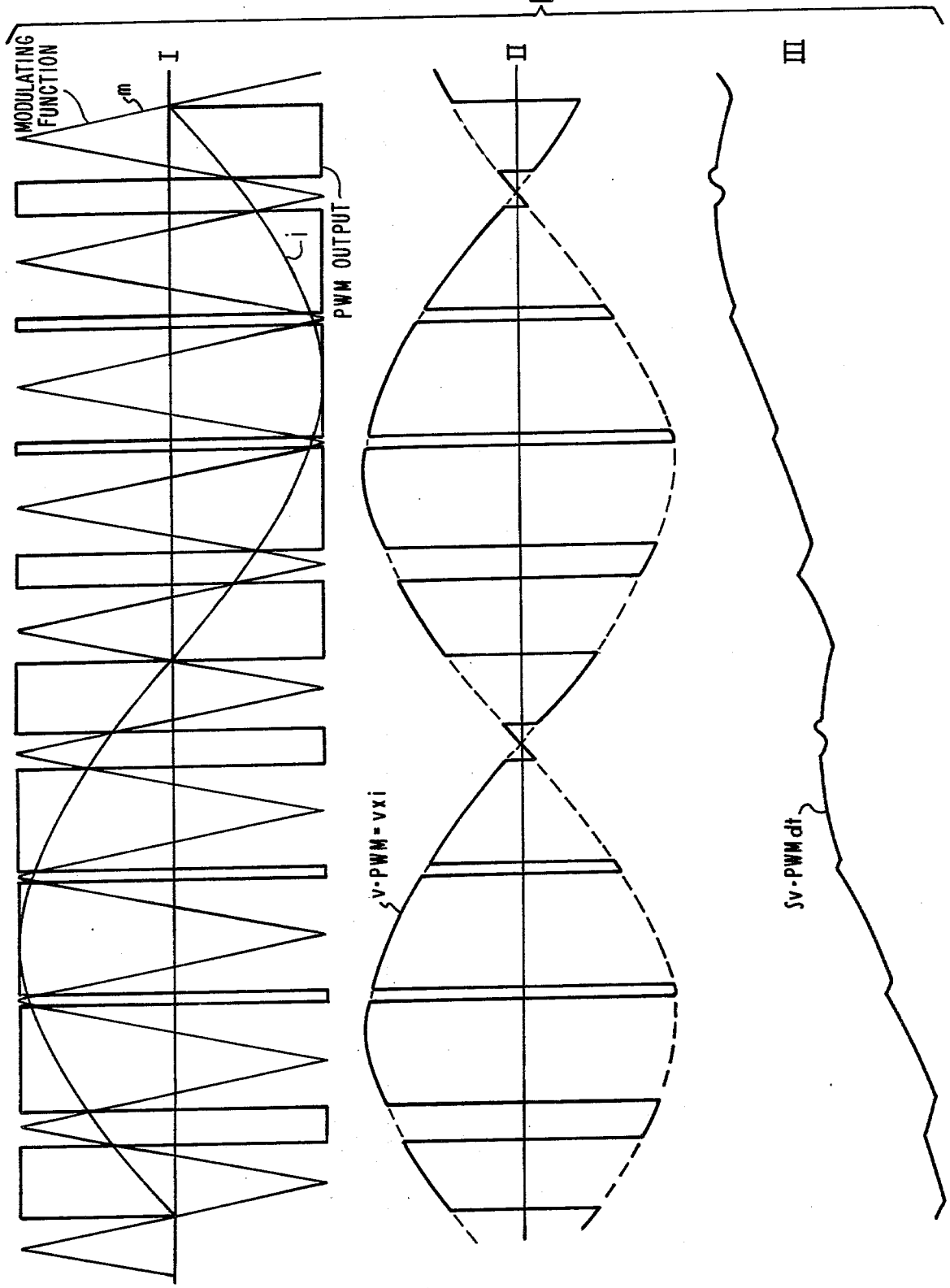

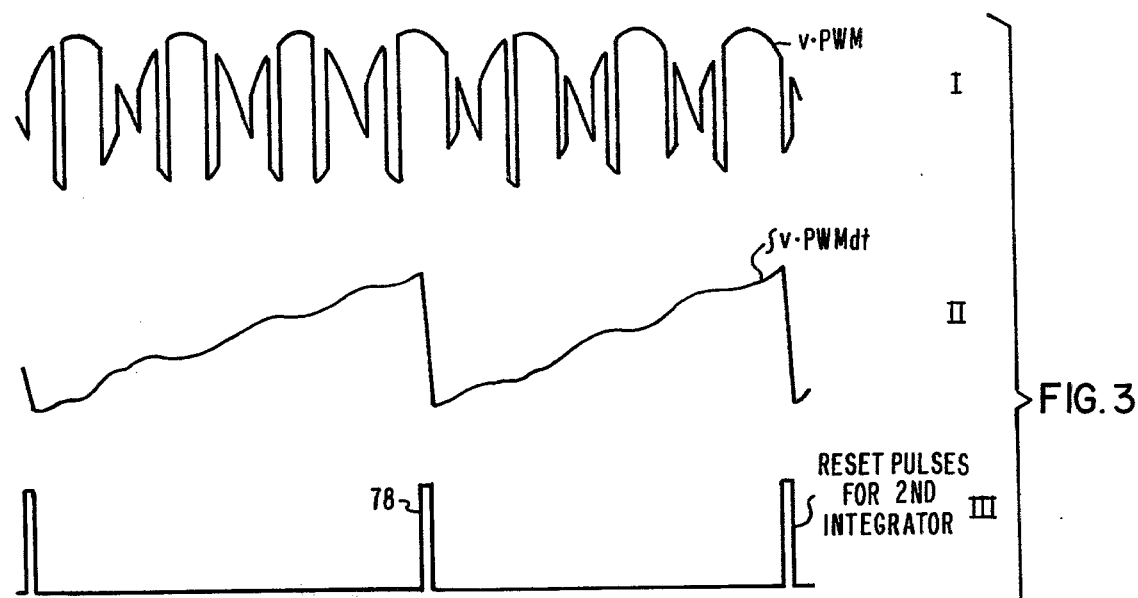
FIG. 3
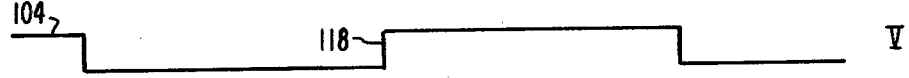
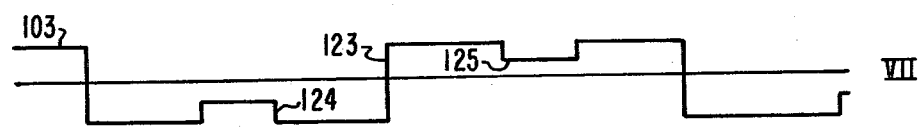
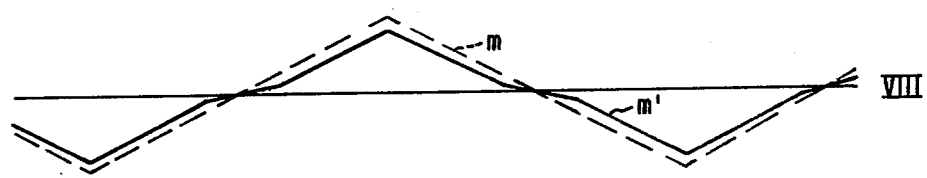
FIG. 5

ELECTRONIC AC ELECTRIC ENERGY MEASURING CIRCUIT

BACKGROUND OF THE INVENTION

1. Field of the Invention

This invention relates to electronic AC electric energy measuring circuits and more particularly to such circuits including improved circuits for multiplying the voltage and current components of an alternating current energy quantity to be measured by uniquely utilizing one of two analog input signals as a time derivative of the current component for producing output pulses representative of quantized amounts of electric energy.

2. Description of the Prior Art

Devices for AC electric energy measurement are extensively used by producers of electric energy for measuring consumption by separate energy users. Typically, watt-hour meters are used for indicating consumption in kilowatt-hours. The watthour meters are usually of the induction type having a rotating disc, which are recognized as having high degrees of reliability and accuracy, being available at reasonable costs, and being capable of outdoor operation under widely varying extremes of temperature and other ambient conditions.

It is also known to measure AC electric energy quantities such as kilowatt-hours, volt-ampere hours, reactive volt-ampere hours, with electronic measuring circuits. Typically, voltage and current sensing transducers provide signals proportional to the voltage and current components of an electric energy quantity to be measured. Analog multiplier circuit arrangements are known in one type of measuring circuit and they are arranged to produce a signal proportional to the time integral of the product of the voltage and current components. One electronic measuring circuit is described in U.S. Pat. No. 3,764,908, assigned to the assignee of this invention, wherein voltage and current signals are applied to a semiconductor device having a logarithmic computing characteristic. An output signal is produced therefrom which is proportional to the product of the voltage and current signals and a measured value of the electric power quantity.

Another known analog multiplier type of electric energy measuring circuit is referred to as a time division multiplication type of measuring circuit. In U.S. Pat. No. 3,864,631, assigned to the assignee of this invention, a further technique of analog multiplication is disclosed. A voltage component signal is sampled to derive a variable pulse width modulated signal corresponding to the voltage component variations. A current component signal is sampled at a rate responsive to the variable pulse width signals. A resultant output is produced, consisting of a series of pulses having amplitudes proportional to the instantaneous current values and pulse widths proportional to the instantaneous voltage values. The resultant signal is filtered to obtain an average value, or DC level, of the pulses which in turn is proportional to an average electric power quantity. The average value signal controls a voltage-to-frequency conversion circuit, utilizing integrating capacitors. Variable frequency pulses from the conversion circuit are totalized, so that a total pulse count is a measure of the electric energy consumption. One of the recognized considerations and limitations of analog multiplying circuits including the time division multiplication type is the effect of changes in the characteristics of capacitor devices required in such circuits. Capacitors having highly linear and constant characteristics under varying temperature and environment conditions and over extended time periods are often quite expensive and difficult to obtain.

In U.S. Pat. Application Ser. No. 919,874, filed June 26, 1978, and assigned to the assignee of this invention, an electric energy measuring circuit and method is described wherein the voltage component of an electric energy quantity to be measured is converted by electric circuit techniques to a signal proportional to the time integral of the voltage component. The time integral voltage signal is compared to incremental reference levels. Each instance that a referenced level is reached, the instantaneous magnitude of the current component is sampled and converted to digital signals. These digital signals are summed to produce an output signal corresponding to a measure of electric energy is watt-hours. Some of the component drift disadvantages of prior analog multiplier circuits are avoided by the aforementioned circuit.

A further example of an electric energy measuring circuit is disclosed in U.S. Pat. No. 4,077,061, assigned to the assignee of this invention, where analog-to-digital sampling of the voltage and current components is performed for subsequent digital processing and calculation. A number of different electric energy parameters are calculated by digital computational circuit techniques.

In each of the aforementioned circuit techniques for electric energy measurements, the voltage and current inputs to the AC energy measuring circuit are provided directly by the line voltage and current or by potential and current transformers for producing signals proportional to the line voltage and current components of the electric energy quantity being measured. Although electronic circuits are operable in small signal ranges, the electric power voltage and currents are several magnitudes larger. Thus, the sensing transducers to provide the voltage and current responsive analog inputs to the measuring circuits must have large transformation ratios which are linear, and in the case of current sensing transducer, the outputs must be linear over a wide range of current values to be sensed.

In typical local energy usage measurements, sixty hertz AC electric power is delivered at substantially constant line voltages of either one hundred-twenty or two hundred-forty volts defining the voltage component of the electric energy quantity to be measured. On the other hand, load currents which define the load component of the electric energy quantity to be measured vary considerably, typically in a range from one-half ampere to two hundred amperes, or in a variation ratio of approximately four hundred to one. Accordingly, standard potential transformer arrangements generally provide adequate voltage sensing transducers while current transformers operating with the aforementioned input line variations and corresponding low level signal outputs require devices which are of substantial size and cost. When it is desired to manufacture electronic AC energy measuring circuits and devices which are relatively compact and comparable in cost to the aforementioned conventional induction type watt-hour meters, the voltage and current sensing transducers present substantial contributions to the overall size and cost of such devices. As is known, accurate current transformer transducers require that the ampere turns of the primary and of the secondary must be equal, and since maximum current levels in the primary reach 200 amperes while producing linear low level output analog signals, such current transformer devices are generally bulky and are relatively costly.

In U.S. Pat. Application Ser. No. 923,619, filed concurrently with this invention, and assigned to the assignee of this invention, a mutual inductance current sensing transducer is described and claimed which overcomes some of the aforementioned limitation of current transformers. The current sensing transducer provides an analog signal proportional to the time derivative of the line current so that an associated AC electric energy measuring circuit must be capable of utilizing the time derivative current signal. The present invention is particularly directed to the aforementioned considerations and limitations caused by the variations and drift tendencies of circuit components required in electronic analog multiplying circuits used for measuring alternating current electric energy quantities and to the use of an analog input signal which is proportional to the derivative of line current with respect to time in such analog multiplying circuits for electric energy measurement.

SUMMARY OF THE INVENTION

In accordance with the present invention, an improved electronic AC electric energy measuring circuit receives analog signals v1 and v2 proportional to line voltage V and line current I components of an alternating current energy quantity to be measured. A first analog signal v1 is proportional to the time derivative of the current component or di/dt. A first modulator circuit including a first integrator circuit receives the first analog signal and a square wave frequency signal so that a common circuit derives both a modulating triangular wave signal and the time integral of the di/dt or the current analog signal i which is directly proportional to the current component I. Comparison of the triangular wave signal and the analog current signal i provides a pulse width modulated (PWM) signal having duty cycles proportional to the current component I. A multiplier circuit includes a second modulator circuit receiving the second or voltage analog signal v2 at a reference signal input of the modulator circuit. A modulating control input receives the PWM signal so as to modulate the voltage analog signal to produce a variable amplitude pulse width modulated signal having an average value equal to v times i and corresponding to the product of the voltage and current components. This average or DC value is also proportional to the average power in watts. The multiplier output signal is applied to an analog to frequency converter circuit including a second integrator circuit so as to produce a signal at the integrator output equal to the time integral of v times i having an increasing amplitude corresponding to electric energy usage in watthours. The second integrator is reset by a precision resetting pulse which is produced upon the integrator output signal reaching a predetermined reference value established at a second comparator circuit. An electric energy indicating output pulse is produced concurrently with the integrator resetting pulse and represent a predetermined quantum of electric energy. The electric energy indicating output pulses are suitable for receipt by a pulse accumulating, recording or totalizing means for registering the measured values of electric energy that is supplied and consumed by an electric load, for example.

A general feature of the present invention is to utilize a voltage analog signal and a time derivative current analog signal as input signals to an AC electric energy measuring circuit utilizing an improved time division multiplication circuit technique.

A further feature of the present invention is to provide an AC electric energy measuring circuit including a single integrator circuit for producing two integrated signals for performing pulse width modulation. One of the integrated signals, i, forms a modulator reference input proportional to line current and the other integrated signal forms a modulating control signal having a triangular wave configuration derived by the integrator circuit for sampling the current signal at a predetermined frequency. Any variations in a common integrating capacitor of the integrator produces the same relative changes in both integrated signals and does not affect their relative values which are detected by a comparator circuit. A pulse width modulated signal is provided by the comparator circuit that has a duty cycle representative of the line current and being substantially free of inaccuracies due to changes in the integrating capacitor characteristics.

A still further feature of the present invention is to provide an analog to frequency converter circuit for receiving a time division multiplier circuit output signal having variable amplitudes responsive to line voltage variations and variable pulse widths responsive to line current variations wherein a second integrator circuit includes a second integrating capacitor receiving the multiplier output signal and a resetting pulse. A second comparator circuit initiates the resetting pulse in response to the voltage on the second integrating capacitor reaching a maximum reference value. Any variations in the characteristics of the second integrating capacitor commonly varies the integrating capacitor opposite charging effects responsive to the multiplier output signal and to the resetting pulse. Thus, the electric energy indicating pulses being initiated concurrently with the resetting pulse are substantially free of inaccuracies due to variations and drifts in the second integrating capacitor characteristics.

A still further feature of this invention is to provide an alternative embodiment of a square wave generator circuit including a compensating circuit arrangement for adjusting the response in the pulse width modulation of the current analog signal produced in response to integration of both a square wave frequency signal and a di/dt analog signal having non-linear response to a sensed line current at low current amplitudes. The compensating circuit arrangement produces a slope variation in a portion of the slope characteristic of the resultant integrated triangular modulation control signal so that comparison with the integrated current analog signal produces proportionately increased current indicating modulation at low line current values. Compensation for current sensing transducer non-linear variations are uniquely provided by controlled adjustment of the current responsive duty cycle modulations.

The aforementioned features are achieved with the efficient use of a minimum number of standard circuit modules and components, for example, the same or similar circuit arrangements are used in each of two integrators and each of two comparators and still further, two different signal frequency circuit inputs are provided by a single clock pulse source. These and other advantages and features of the present invention will become apparent from the detailed description of the preferred embodiments shown in the drawings briefly described hereinafter.

BRIEF DESCRIPTION OF THE DRAWINGS

FIG. 2 is a time graph of signals occurring in the circuit shown in FIG. 1;

FIG. 3 is another time graph of signals occurring in the circuit shown in FIG. 1 in a different time scale than in FIG. 2;

FIG. 5 is a time graph of pulse signals occurring in the circuit shown in FIG. 4.

DESCRIPTION OF THE PREFERRED EMBODIMENTS

Figures 1, 4:
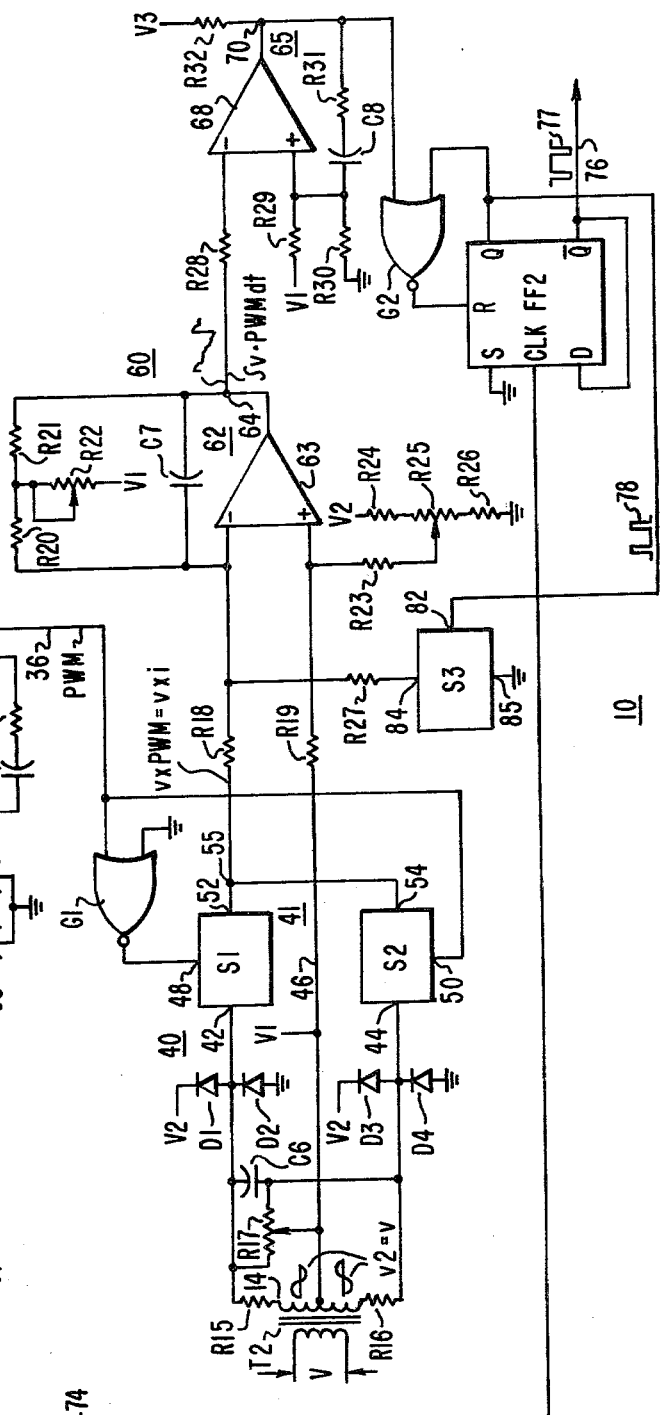
FIG. 1 is an electrical schematic diagram of an electronic AC electric energy measuring circuit made in accordance with the present invention.
FIG. 4 is an electrical circuit diagram of an alternative circuit for a signal frequency source portion of the circuit shown in FIG. 1.

Referring now to the drawings and more particularly to FIG. 1, there is shown an electronic AC electric energy measuring circuit 10 made in accordance with the present invention. The circuit 10 measures an alternating current energy quantity including a line current component I and a line voltage component V applied to a current sensing transducer T1 and a voltage sensing transducer T2, respectively. By way of example and not limitation, the measured electric energy has a conventional electric power network frequency of sixty Hertz and a variation in the line current component I extends to a typical maximum value of 200 amperes. The voltage component V has typically constant values of either 120 or 240 volts. The current component I and voltage component V are also referred to as line current and line voltage as they would be applied to the service entrance conductors of a residential electric energy consumer supplied by an electric power supplier or utility.

The current sensing transducer T1 produces a first analog signal v1 to input 12 to the circuit 10. Signal v1 is formed by a derivative with respect to time of the line current I and has a value expressed as di/dt. One current sensing transducer capable of producing the time derivative of the current I is disclosed in U.S. Pat. Application Ser. No. 923,619, filed concurrently with this invention and assigned to the same assignee as this invention. The di/dt analog signal v1 will have the same signal form and frequency as the alternating current component I except that the di/dt analog signal will be a voltage signal occurring across the output of the secondary winding of the transducer T1 that is phase shifted by ninety electrical degrees of the current I and having an amplitude variation which is proportional to variations of the current I. Maximum value of the di/dt signal is in the order of 3 to 5 volts at the first or current responsive input 12 of the circuit 10 at a maximum value of the current I of 200 amperes.

A voltage sensing transducer T2 develops a voltage analog signal v2 having two 180° out of phase components developed at the outputs of a center tapped secondary winding of the transducer T2. The amplitude of the voltage analog signals v1 having the same frequency and are equal to value v proportional to the voltage component V having a maximum value in the order of 3½ to 5 volts on either side of the center tap of the secondary winding of the transducer T2. Analog signal v2 is applied to the second or voltage responsive input 14 of the electric energy measuring circuit 10. The di/dt analog signal v1 is applied across the input of a first modulator circuit 16 including a first integrator circuit 18 and a first comparator circuit 20. The integrator circuit 18 includes an operational amplifier 21 having an integrating capacitor C2 connected between the output thereof and the inverting input thereof. Four operational amplifiers including the amplifier 21 shown in FIG. 1 may be provided by a circuit module type MC 3405 available from Motorola, Inc. A resistor R1 is connected in series with the inverting input and a resistor R2 is connected in series with the non-inverting input and resistors R1 and R2 are also connected to the outputs of the secondary winding of T1 providing the voltage v1 proportional to di/dt and forming the current responsive analog signal input. A regulated voltage V1 supplied by a power supply, not shown, provides a fixed regulated voltage which may be 7½ volts DC. The integrating capacitor C2 has connected in parallel therewith the resistor R4 wherein the capacitor C2 has an exemplary of value of 0.022 microfarad, resistor R4 is typically 10 megohms and the resistors R1 and R2 have substantially high values in the order of 900 kilo-ohms.

A signal frequency source 22 includes a square wave signal generator 23 which applies square wave pulses to the inverting input of the operational amplifier 21 from terminal 24. The square wave signal generator 23 includes a source 25 of clock signals applying 4 kHz clock pulses to the flip flop FF1, as shown, to produce 2 kHz square wave pulses through a capacitor C1 and resistor R3 to the integrating capacitor C2 and the inverting input of the operational amplifier 21. The integrator circuit 18 provides two superimposed integrated signals in response to the square wave frequency signals from generator 23 and to the di/dt analog signal v1 at the output of the operational amplifier 21.

A triangular modulating function control signal m shown in graph I in FIG. 2 is produced by the integrated output of the square wave signal input. The current analog signal i also indicated in graph I in FIG. 2 is produced in response to the integrated output of the time derivative signal di/dt. Accordingly, the analog signal i is a signal proportionally corresponding to the current component I since the integral with respect to time of the di/dt is equal to i. The current analog signal i forms the reference input of the modulator circuit 16 and the triangular wave m forms the modulating function control signal of the modulator 16. The frequency of the signal m in graph I of FIG. 2 is substantially less than the 2 kHz noted above as shown with respect to the sixty Hz frequency of signal i.

At the output of the operational amplifier 21, the triangular modulating control signal m is effectively combined with the signal i by superposition thereon so that increases in amplitude of the line current I causes the triangular signal 27 to undulate at proportional increasing amplitudes with increasing amplitudes of the analog signal i. The operational amplifier 21 is responsive to a variation in the di/dt analog signal in a ratio of approximately one to 400 so that the output of the operational amplifier 21 varies between a maximum of approximately 1 volt to a minimum value in the order of 2.5 millivolts.

The output of the operational amplifier 21 in the comparator circuit 20 is applied to the inverting input of an operational amplifier 30 through the resistor R5. Resistors R9, R10, R11 and R12 provide a predetermined proportion of a fixed reference voltage V2, which may be in the order of 12.5 volts DC, to the inverting input to provide a predetermined offset. A two pole RC filter network including resistor R6 and R7 and capacitors C3 and C4 is connected, as shown, between the output of the operational amplifier 21 and the resistor R8 connected to the non-inverting input of the operational amplifier 30. The capacitor C5 and resistor R14 are connected in series to provide regenerative feedback between the output of the operational amplifier 30 and the non-inverting input to produce quick transitions to the amplifier operates in the comparator mode. The comparator reference level is effectively established by the V1 voltage connected to the resistor R2 also connected to the non-inverting input of the operational amplifier 21. The filtering network including the resistors R6 and R7 and capacitors C3 and C4 subtract a DC value of the combined triangular modulating signal and of the current signal i.

The output of the operational amplifier 30 is connected to through the resistor R13 to the voltage V3 which is an unregulated voltage in the range of approximately +15 volts DC and provides the constant amplitude and variable pulse width modulated signal output PWM shown in the graph I of FIG. 2. The variable duty cycle or variations in pulse width modulation of the signal PWM are proportional to the variations in amplitude of the input di/dt analog signal and, accordingly, of the line current I. At zero to approximately one-half ampere line current values, the duty cycle provided in the signal PWM at the output of the operational amplifier 32 is substantially 50% positive and 50% negative as the comparator circuit 20 is switched between substantially the voltage of V3 and ground during equal pulse time or duty cycle intervals. The pulse width modulated PWM signal has the duty cycle thereof varied by the variations of the analog signal i as the amplitude thereof or RMS value increases. As the signal i RMS value increases, the triangular modulating signal m effectively rides or oscillates about the frequency of the current signal with its frequency being in the order of two kHz. This raises the level of the signal m with respect to the reference established at the non-inverting input of the operational amplifier 30 so as to proportionately vary the duty cycle of the PWM signal.

For maximum values of the i analog signal, shown in the top graph I of FIG. 2, the PWM signal will substantially remain at the positive level during the first 180° or half cycle of the signal i and then will remain at the negative level substantially all the time during the last half cycle of the i signal. Accordingly, as just described hereinabove, the signal at the output of the comparator circuit 20 as provided by the operational amplifier 30 provides a constant amplitude variable pulse width or variable duty cycle signal responsive to the amplitude of the line current I. The conductor 36 provides the PWM output signal of the comparator 20 to the second portion of the circuit 10 receiving the voltage analog signal v2 at the input 14 thereof in response to the line voltage V.

The voltage analog signal v2 is applied to a multiplier circuit 40 receiving the two 180° out of phase signals thereof. The voltage analog signal v2 being applied as a modulator reference input to a second modulator circuit 41 included in the circuit 40 and provided by the transistor switch devices S1 and S2 each formed by a CMOS type 4066 bilateral transistor switch circuit available from RCA Corporation. The signal inputs 42 and 44 of the switch circuits S1 and S2 are connected through the resistors R15 and R16 to the outer legs of the secondary winding of the transducer T2 formed by step down potential transformer. The input 42 is also connected to the junction of series diodes D1 and D2 connected in series between the circuit ground and the fixed reference voltage V2. Similarly, the input 44 of the switch circuit S2 is connected to the junction of series diodes D3 and D4 connected in series between ground and the voltage V2 so as to limit the maximum voltages being applied at the inputs 42 and 44. The center tap of the secondary winding of the transducer 72 is connected to the reference source V1 and the conductor 46 so as to establish a predetermined reference thereat for reversing the charged state of a second integrating capacitor C7. A potentiometer R17 may be connected across the switch circuit inputs 42 and 44 with a capacitor C6 connected in parallel therewith. The slider terminal of the potentiometer R17 is connected to the center tap of the secondary of T2 and to the junction of the voltage V1 and the conductor 46. The switch circuits S1 and S2 have control inputs 48 and 50 connected to respond to the two voltage states and current modulated representations of the PWM signal on the conductor 36.

The control input 50 is directly connected to the conductor 36 by an inverter circuit formed by an OR gate G1 having one input connected to the conductor 36 and the output connected to input 48. The other G1 gate input is connected to ground. Thus, an inverted form of the PWM signal occurring on the conductor 36 appears at the control input 48.

The output of the multiplier 40 is formed by the outputs 52 and 54 of the modulator circuit switch circuits 48 and 50 which are connected together at a common junction 55. The signal inputs at the inputs 42 and 44 of the switch circuits S1 and S2 are connected to the outputs 52 and 54, respectively, when the voltage at the control inputs 48 and 50 is at a low or negative logic state. Thus, the two portions of the voltage analog signal v are alternately passed through the switch circuits S1 and S2 in response to the positive and negative states of the PWM signal occurring on the conductor 36 to provide a variable amplitude and variable pulse width signal at the junction 55 which has an average or DC value equal to the product of the signals v and PWM corresponding to the average power developed by the line current I and line voltage V which are the components of the alternating current energy quantity to be measured by the circuit 10.

The outputs of the switches S1 and S2 are responsive to the duty cycle of the PWM signal on conductor 36 and the amplitude of the voltage v producing the average power signal at the junction 55 as noted hereinabove. This resultant signal occurring at the junction 55 is shown in the center graph II of FIG. 2. The upper end of the secondary winding of T2 is applied through the switch S1 when the PWM signal, shown in the graph I of signals of FIG. 2, is positive and the voltage v occurring at the lower terminal of the secondary winding of the transducer T2 is applied to the switch 2 when the level of the PWM signal is low or zero as shown in FIG. 2.

In order to provide an indication of the measure of alternating current energy resulting from the current I and voltage V, an analog to frequency converter circuit 60 is provided at the output of the circuit 10. The circuit 60 includes a second integrator circuit 62 including an operational amplifier 63 connected as shown with the second integrating capacitor C7 connected between the output thereof and the inverting input of the amplifier 63. The junction 55 is connected through the resistor R18 to the common junction of the second integrating capacitor C7 and the inverting input of the operational amplifier 63. The resistor network R20, R21 and R22 is connected with the reference voltage V1 and across the capacitor C7 as shown in FIG. 1. The resistor R18 as a value in the order of 82.5 kilo-ohms and the integrating capacitor C7 has a value in the order of 0.1 microfarad.

The non-inverting input of the amplifier 63 receives the reference voltage V1 through the resistor R19. The non-inverting input of the operational amplifier 63 is further connected to a resistor network including the resistors R23, R24, potentiometer R25 and resistor R26 connected between ground and the reference voltage V2. The time constant on the second integrator circuit 62 is substantially established by the resistor R18 and capacitor C7 so that the voltage occurring at the output 64 of the operational amplifier 63 is shown in the lower graph III shown in FIG. 2. The voltage developed across the integrating capacitor C7 is accumulated in response to the v x i signal occurring at the junction 55. The signal at 55 is responsive to the time integral of v times PWM dt or the electric energy produced by the current I and voltage V. Since the signal occurring at the output 55 continues to increase a means for resetting the integrator must be provided. It is noted that while the signal shown at the bottom graph III of FIG. 2 increases in a positive direction and the operation of the integrator circuit 62 in FIG. 1, the signal actually decreases in an analogous manner in an increasing negative direction as the capacitor C7 is charged at the signal at output 55.

The analog to frequency converter circuit 60 further includes a second comparator circuit 65 including an operational amplifier 68 having the inverting input thereof receiving through resistor R28 the output 64 of the second integrator circuit 62. The non-inverting input of the operational amplifier 68 is connected to a voltage reference circuit including the resistors R29 and R30 connected between the non-inverting input, the voltage V1 and the circuit ground. The output 70 of the operational amplifier 68 is connected through the regenerative feedback path formed by capacitor C8 and resistor R31 also to the non-inverting input. The voltage provided at the non-inverting input of the operational amplifier 68 by the voltage divider resistors R29 and R30 and the voltage V1 is approximately in the order of 2 volts.

Whenever the integrator output voltage at the inverting input of the operational amplifier 68 reaches the reference voltage at the non-inverting input thereof, the comparator output 70, connected through the resistor R32 to the voltage V3 switches positive. The comparator output 70 is applied to one input of a NOR gate G2. A flip flop circuit FF2 receives the output of the gate G2 at the reset input R thereof. The other input to the gate G2 is coupled to the Q output of the flip flop FF2. The clock input of FF2 receives clock pulses from conductor 74 connected to the clock pulse source 25 producing 4 kHz pulses at the terminal 75 of circuit 22. The $\overline{Q}$ output of the flip flop FF2 is connected to the output conductor 76 providing the electric energy indicating pulses 77 of the circuit 10.

When the comparator output 70 switches positive, it causes the output of the gate G2 to go to a logic low level and prior to that time, the gate G2 output was holding the flip flop circuit FF2 in the reset state so as to not allow the flip flop circuit to toggle. As soon as the output of the gate G2 goes to the low logic level, the next clock pulse occurring from the clock source 22, it will cause the flip flop FF2 to toggle. The 4 kilohertz clock pulses are accurate and stable so as to provide precision pulses 78 from the flip flop circuit FF2 to the control input 82 of a transistor switch circuit S3 also being of a type 4066. The pulses 78 are precision in time duration because they are responsive to the clock pulses generated at clock pulse 25 in a manner that corresponding pulses are generated in the circuit in FIG. 4.

The pulse output 78 from the Q output of the flip flop FF2 activates the switch S3 so that the switch output 84 connects the resistor R27 to ground at switch input 85. The other terminal end of resistor R27 is connected to the inverting input of the operational amplifier 63.

As the v×i signal charges the integrating capacitor C7, the voltage at integrator output 64 increases negatively in a manner corresponding to that shown in graph III. The non-inverting and inverting inputs of the operational amplifier 63 are substantially balanced because of the feedback to the non-inverting input thereof. As the switch S3 is activated by triggering the comparator circuit 65 and initiating the pulse signal 78, the grounding of the resistor R27 unbalances the inputs of the amplifier 63. The fixed reference voltage at the non-inverting input, established by the voltage V1, initiates an unbalance at the inputs for an exact time determined by the precise time duration of the clock pulses establishing the pulses 78 applied to the switch S3. Prior to reset, the integrator output 64 actually decreases although the graph III in FIG. 2 and graph II in FIG. 3 shows the corresponding output increasing. The resetting of the integrating capacitor C7 by the pulse 78 drives the output 64 in the opposite direction by reducing the charge on the integrating capacitor C7 due to the operation of the integrator circuit 62 with unbalanced inputs to the amplifier 63.

It is an important feature of the present invention that the resetting pulse 78 affects precision resetting of the integrator capacitor C7 at the same terminal at which the integrating capacitor is being charged by the output of the circuit junction 55. Changes in the characteristics of the integrating capacitor C7 does not change any relative variations between the opposite charging effects on the capacitor C7 by the v×i output signal occurring at the junction 55 and by the resetting affect of the pulses 78 that grounds one side of the capacitor while the other side goes high. Thus, the integrator output 64 is rendered substantially insensitive to the variations in the characteristics of the capacitor C7. The operation of the flip flop FF2 in response to the 4 kilohertz clock signals to activate the switch S3 and to effect for a precise time a precise voltage across the capacitor C7 opposite to the level of the voltage capacitor which initiates the reset operation may be referred to as a precision charge pump operation for resetting the integrator 62. The precision capacitor resetting does not interrupt the measuring integrator charging effects of the signal output of junction 55.

Referring further to the time graphs of signals included in FIGS. 2 and 3, the graphs of signals I, II, III and IV shown in FIG. 3 indicate simplied forms of the signals occurring in the circuit 10 for purposes of explanation. The top graph I illustrates the power representing signal occurring at the output 55. The relative time scale of the signal shown in FIG. 3 is for a slightly longer time interval than that of the signal shown in FIG. 2. The frequency of modulation is also not shown proportional to the sixty Hz frequency of the voltage and current analog signals in order to simplify the drawing. For example, the frequency of the triangular modulating signal m in the upper graph I of FIG. 2 would be at a considerably higher repetition rate than that illustrated. Correspondingly, the modulated signal of the signal occurring at the output 55, shown in the upper graph I of FIG. 3, would have a higher number of modulated pulse widths, it being understood that these modulations vary in response to the changes in the RMS values of current signal i. A further identification of the graph II relative to the graph I in FIG. 2 is that they correspond to a condition where the line current component I lags the line voltage component V by a thirty percent power factor. The envelope of the signal of graph II is produced by analog signal v2 having two components corresponding to an analog value v proportionally representing the voltage component V. As is well known, energy in watthours $WHr = vi \cos \theta \, dt$ over a predetermined time interval where $\cos \theta$ corresponds to the power factor. The graph II of FIG. 3 illustrates the integrator voltage developed at the output 64 of the second integrator circuit 62 in response to the signals appearing at the output 55. The integrator resetting pulses 78 are shown in graph III as they occur to control the repetitive charging of the integrating capacitor C7. The time graph IV of pulses 78 illustrate the electric energy indicating pulses 78 as produced in the same response to the initiation of the resetting pulses 78. It is understood that each of the pulses 77 produced at the output conductor 76 of the circuit 10 represents a quantized amount of the alternating current energy quantity measured by the energy measuring circuit 10 of this invention. Circuits and counting devices for accumulating totalizing or recording of the pulses 76 to produce corresponding readings of total watthour consumption and usage are well known.

FIG. 4 discloses an alternative frequency signal source 90 intended to replace the corresponding signal source 22 shown in FIG. 1. Modified square wave pulses and clock pulses are produced at the terminals 24 and 75 shown in FIG. 1. It has been found that in some instances the mutual inductance current sensing transducer T1 may produce non-linear responses at low current value of line current I so that the di/dt ouput is disproportionately lower at low current I values than at higher current I values. Accordingly, an important feature of the circuit of source 90 is to vary the slope of a modified triangular modulating control signal m' which varies from that of the signal m shown in graph I of FIG. 2 and described further hereinbelow in connection with the description of the graph VIII of signals shown in FIG. 5. These variations are produced about low or zero values of the analog current signal i so that the slope is made smaller than the remaining slope of the modulating signal m' at larger values of the analog signal i in order to increase the gain of the pulse width modulating function of the first modulator 16 for small amplitudes of the line current I.

The clock pulse source 25 shown in FIG. 1 is provided in a manner similar to that in the circuit 90 by utilizing a 32 kHz crystal control oscillator 92 having precisely controlled frequency and output applied to the clock input of a divide by 8 counter/divider circuit 94 of a type CD4022B available from the RCA Corporation Solid State Division, Somerville, N.J. 08876. Eight gating outputs "0" through "7" are provided by circuit 94. The divider circuit 94 provides the pulse outputs on the conductor 97 in response to the "5" output as shown in FIG. 4. These pulses are produced at the 4 kHz frequency to terminal 75 for applying to the clock input of flip flop circuit FF2 in FIG. 1. The "0" and "1" outputs of the circuit 94 are applied to an OR gate 98 having an output 100 applied to the exclusive-OR circuit 101. The output of the gate 101 is connected to the series resistors R35, potentiometer R36 and resistor R37. The slider tap of the potentiometer R36 is applied through a capacitor C1 which is the same C1 shown in FIG. 1 to a conductor 103 connected with the terminal 24 connected to the junction of resistor R4 and the first integrating capacitor C2 of FIG. 1. A flip flop circuit FF3 is connected as shown in FIG. 4 with the Q input connected to one terminal of the resistor R37 and to the other input of the gate 101. The output of the conductor 103 provides modified forms of two kHz square wave pulses and that produced at the output through resistor R3 in FIG. 1. The variation in the square wave pulse as described further in connection with the description of the time graph of signals shown in FIG. 5 is effective to vary the slope of the triangular modulating control signal about initial and low values of current.

In the operation of the circuit shown in FIG. 4, the FIG. 5 shows time graphs I, II, III, IV, V, VI and VII of signals occurring at the circuit locations 95, 96, 97, 100, 104, 102, 103. The resulting effect produced in the modified triangular modulating control signal m' is shown in graph VIII with respect to the triangular wave modulating control signal m produced by the square wave pulses supplied from the output of the flip flop FF1 in FIG. 1. The "0" output 95 of the circuit 94 produces the pulses 108 and the "1" output at 96 produces the pulse 110 in response to the 32 kHz signals from the oscillator 92. The "5" output at 97 produces the pulses 112 shown in graph III of FIG. 5. The OR gate 98 produces the pulse 114 in response to the occurrence of the pulses 108 and 110 at the input thereof. The Q output of flip flop FF3 at 104 produces the signal 118 in response to the pulses 112 as indicated in FIG. 5. The output 102 of the gate 101 combines the inputs thereof from circuit locations 100 and 104 to produce the pulse signal 120. The signal 118 has the same square wave signal and period produced for the 4 kHz clock input to the first integrator circuit 20 in FIG. 1. By adjusting the potentiometer R36, the composite and modified form of the 4 kHz clock pulses is shown in the signal 120 occurring at gate output 102 of the circuit 90. It is seen that in the middle of each half square wave 123 occurring on conductor 103, has the center thereof with offset portions 124 and 125 produced by the pulses 114 at the output of the OR gate 98. The clock pulse 123 without the portions 124 and 125, produces the triangular modulating control signal m shown in the broken line m in graph VIII which is also shown in the upper graph I of FIG. 2. This is produced by the operation of the integrating capacitor C2 in FIG. 1. With the modifying portions 124 and 125 in the pulse 122, the modified triangular modulating control signal m' is produced by the integrator circuit 18 when the frequency signal source 90 is utilized instead of source 22 in the circuit 10 of FIG. 1. As is shown in the signal m' in graph VIII, the time intervals thereof during the durations of the pulse 123 modifying portions 124 and 125 include a decreased slope of the raising and falling portions of the triangular modulation signal m'. The effect of the signal slope changes is to increase the gain of the pulse width modulating operation of the modulator 16 when generating the PWM signal at low values of line current I. Accordingly, compensation for the low level non-linear response of the current sensing transducer T1 is provided. The di/dt analog signal will be more linearly proportional to the line current I.

The AC electric energy measuring circuit 10 described hereinabove provides an efficient, accurate and novel circuit and method for measuring an alternating current electric energy quantity. It will be apparent to those skilled in the art that obvious modifications and variations of the circuit 10 may be made without departing from the spirit and scope of this invention.

We claim:

1. An AC electric energy measuring circuit comprising:
   a current responsive input for receiving a first analog signal being responsive to the time derivative of a current component of an alternating current energy quantity to be measured;
   a source of square wave pulses including a frequency substantially greater than the frequency of said alternating current energy quantity to be measured;
   a first modulator circuit including a first integrator circuit responsive to said first analog signal and said square wave pulses at a common input thereof and further including an output producing a constant amplitude pulse width modulated signal variable in response to variations in amplitude of said current component;
   a voltage responsive input responsive to a second analog signal proportional to a voltage component of the alternating current energy quantity to be measured;
   a multiplier circuit including a second modulator circuit responsive to said second analog signal and to said constant amplitude pulse width modulated signal so as to produce a variable amplitude pulse width modulated signal corresponding to the product of said current and voltage components so that the average value thereof is representative of a measure of average power produced by said voltage and current components; and
   an analog to frequency converter circuit including a second integrator circuit responsive to said variable amplitude pulse width modulated signal so as to produce output pulse signals, wherein each output pulse represents a quantized amount of said alternating current energy quantity to be measured.

2. An AC electric energy measuring circuit as claimed in claim 1 wherein said first analog signal is a variable voltage responsive to said time derivative of the current component and said square wave pulses have alternate voltage amplitudes so that first and second superimposed integrated signals are produced at the output of said first integrator circuit with the first integrated signal defining a current analog signal and the second integrated signal defining a triangular modulating function control signal having frequency corresponding to said frequency of said square wave signals.

3. An AC electric energy measuring circuit as claimed in claim 2 wherein said first integrator circuit includes an operational amplifier and a single integrating capacitor connected between the amplifier output and the inverting input thereof.

4. An AC electric energy measuring circuit as claimed in claim 3 wherein said first modulator circuit includes a comparator circuit having a first input responsive to the combined first and second integrated signals and a second input responsive to a predetermined reference voltage value, said comparator circuit further including an output switchable between two constant values in response to the variations of said second integrated signal being above and below the reference voltage value at said second input.

5. An AC electric energy measuring circuit as claimed in claim 4 wherein said comparator circuit includes an operational amplifier having the non-inverting and inverting inputs thereof providing said first and second inputs of said comparator circuit.

6. An AC electric energy measuring circuit as claimed in claim 5 wherein said second integrator circuit of said analog to frequency converter circuit includes an operational amplifier having an inverting input receiving said variable amplitude pulse width modulated signal, a non-inverting input receiving a fixed predetermined reference voltage and further includes an integrating capacitor connected between the output of said operational amplifier and said inverting input.

7. An AC electric energy measuring circuit as claimed in claim 6 wherein said analog to frequency converter circuit includes circuit means including a comparator circuit for resetting said integrating capacitor thereof in response to the output of said operational amplifier thereof reaching a reference level detected by said comparator circuit.

8. An AC electric energy measuring circuit as claimed in claim 7 including a source of clock pulses and wherein said circuit means of said analog to frequency converter circuit further includes switch means having an input and an output connected between said inverting input of said operational amplifier and a circuit ground reference, said switch means further having a switch control input responsive to one of said clock pulses upon said output of said operational amplifier reaching said reference level so as to activate said switch means to operatively connect said circuit ground reference to said inverting input during the duration of the one clock pulse.

9. An AC electric energy measuring circuit as claimed in claim 8 including a crystal controlled oscillator means and wherein said source of square wave pulses and said source of clock pulses are both produced at frequencies responsive to the frequency of signals produced at the output of said oscillator means.

10. An AC electric energy measuring circuit as claimed in claim 2 wherein said source of square wave signals includes means generating first pulse signals defining said frequency of said square wave signals, means generating second pulse signals having pulse durations less than the pulse durations of said first pulse signals, and means combining said first and second pulse signals to produce said square wave signals with modified portions thereof for producing changes in selected portions of second integrated signal.

11. An AC electric energy measuring circuit as claimed in claim 10 wherein said source of square wave signals includes oscillator means, a counter means having first, second and third outputs, a NOR gate receiving said first and second outputs, an exclusive-OR gate receiving the output of the NOR gate at one input, a flip flop circuit having a clock input receiving said third output and a Q output connected to the other input to said exclusive-OR gate, resistor means connected between the output of said exclusive-OR gate and said Q output and means connected to said resistor means for producing said square wave signals with predetermined modified portions thereof.

* * * * *